United States Patent [19]
Su

[11] Patent Number: 5,943,278
[45] Date of Patent: Aug. 24, 1999

[54] SRAM WITH FAST WRITE CAPABILITY

[75] Inventor: Yuan-Mou Su, Cupertino, Calif.

[73] Assignee: Winbond Electronics Corporation, China

[21] Appl. No.: 08/755,289

[22] Filed: Nov. 22, 1996

[51] Int. Cl.$^6$ ..................................................... G11C 7/00
[52] U.S. Cl. .................... 365/204; 365/190; 365/189.11; 365/189.05
[58] Field of Search .............................. 365/190, 189.11, 365/204, 189.05

[56] References Cited

U.S. PATENT DOCUMENTS 5,771,190  6/1998  Okamura ................................. 365/154

*Primary Examiner*—Andrew Q. Tran
*Attorney, Agent, or Firm*—Proskauer Rose LLP

[57] ABSTRACT

In accordance with a preferred embodiment of the invention, the write cycle of an SRAM column is increased. The SRAM column includes at least one SRAM cell connected to the bit line and the bit line complement of the column. Further, a pair of select transistors are located below the bottom SRAM cell, where one select transistor is connected to the bit line and the other is connected to the bit line complement. The select transistors select whether the respective bit line and bit line complement is deselected or selected. The SRAM column further includes a pair of load transistors connected between the bottom SRAM cell and the pair of select transistors, where one of the load transistors is connected to the bit line and the other load transistor is connected to said bit line complement. In operation, since the load transistors are located below the bottom cell, there is no DC current supplied by the load transistors to flow through the entire bit line and bit line complement length. Therefore, the voltage drop potential on the line is reduced which increases the write cycle speed.

3 Claims, 6 Drawing Sheets

SRAM WITH FAST WRITE CAPABILITY

FIELD OF THE INVENTION

The present invention relates to an SRAM (Static Random Access Memory), and, more particularly, to an SRAM with fast write capability.

BACKGROUND OF THE INVENTION

An SRAM (Static Random Access Memory) cell is shown in FIG. 1. FIG. 1 schematically illustrates an SRAM cell 10. The SRAM cell 10 comprises first and second drivers N1 and N2. Illustratively, the drivers N1 and N2 are pulldown NMOS devices. The source 12 of N1 and the source 14 of N2 are connected to a reference voltage Vss which, for example, is ground. The drain 16 of N2 is connected to the gate 18 of N1. The drain 20 of N1 is connected to the gate 22 of N2. The SRAM cell 10 of FIG. 1 also comprises two load devices L1 and L2. The load devices L1 and L2 each have one terminal 24, 26 connected to a reference voltage Vcc and another terminal 28, 30 connected to the drains 20, 16 of N1 and N2, respectively. The reference Vcc is positive with respect to Vss.

The SRAM cell 10 also comprises two additional NMOS devices Mx and My. The devices Mx and My are pass transistors. The gates 32, 34 of Mx and My are connected to a wordline whose signal value is designated WORD. The sources 36, 38 of Mx and My are connected to bit lines 33, 35 whose signal values are designated BL and BLB (BL complement), respectively. The drains 40, 42 of Mx and My are connected the drains 20, 16 of N1 and N2, respectively. The bit lines 33, 35 are connected to the reference voltage Vcc via the NMOS devices M1, M2. The signals BL and BLB are applied to the bit lines 33 and 35 by applying appropriate signals to the gates of M1 and M2, respectively.

To write the cell, DATA (logic "1" or logic "0") is placed on the BL line 33 and DATAB is placed on the BLB 35 line. Then WORD is asserted. A read operation commences by precharging the BL and BLB lines. The WORD signal is asserted and either the BL or BLB line will be discharged by one of the pull down transistors N1 or N2.

The current path of the SRAM cell of FIG. 1 is indicated by the path 39 (or 41). The current path is along the bit line 33 (or 35), through Mx (or My), and through the driver N1 (or N2) to ground.

The purpose of the load devices L1 and L2 is to counteract the effect of charge leakage at the drains 20, 16 of N1 and N2. The load devices L1 and L2 may be polycrystalline silicon resistors or PMOS devices. In the case where L1 and L2 are PMOS devices, the sources of the PMOS devices are connected to Vcc; the drains of the PMOS devices are connected to the drains 20, 16 of N1 and N2. The gates of the PMOS devices L1, L2 are connected to the gates of the NMOS pull down driver devices N1, N2, respectively.

To reduce the size of the SRAM cell 10 and for use in advanced applications, where higher density and lower standby power is required, the load devices L1 and L2 may be implemented as thin film transistor (TFT) PMOS devices. In this case, the SRAM cell is known as a TFT SRAM cell.

A conventional SRAM array is shown in FIG. 2. FIG. 2 shows an m x n array 50 of memory cells 52 of the type shown in FIG. 1. The array of cells is organized into rows and columns. The columns are designed CLØ, CL1, . . . , CLn. Each column has two bit lines associated with it. These bit lines are designed BLØ, BLBØ, BL1, BLB1; . . . ; BLn, BLBn. The bit lines are connected to Vcc by the NMOS devices $M1_\emptyset$, $M2_\emptyset$, $M1_1$, $M2_1$, . . . , $M1_n$, $M2_n$. The bit lines are precharged for a read operation using the NMOS devices M1, M2. For a write operation DATA and DATAB signals are placed on the bit lines via write buffer circuitry of the column select transistors M3–M6. These column select transistors will be described in greater detail below with reference to FIG. 3. Each row of cells has a wordline WLØ, WL1, . . . , WLk. Each wordline has associated with it a wordline decoder 12-0, 12-1, . . . , 12-m which comprises the PMOS devices P5, P6 and the NMOS devices N5, N6.

A column CL from the array 50 of FIG. 2 is shown in greater detail in FIG. 3. In particular, FIG. 3 shows certain circuitry 60 associated with each column of the SRAM array in FIG. 2. However, for purposes of clarity, the circuitry 60 shown in FIG. 3 is only illustrated in connection with one such column. Column select circuitry 65 comprises select transistor pairs NMOS M4, PMOS M3 and PMOS M5, NMOS M6. Generally, to select a column, the column select signal $Y_0$ is applied to transistors M4 and M6 and the column select signal $Y_0B$ is applied to transistors M3 and M5.

Sense amplifier SA is coupled to bit lines BL and BLB of column CL0 along lines CDL (common data line) and CDLB, respectively. Further, one SA may be coupled to a plurality of columns since only one cell of one column will be read at any one time. As is known, sense amplifier SA functions during a read cycle of column CL, where SA determines the voltage difference between BL (BLB), which is established by the memory cell current, and load transistor M1 (M2) by outputing a logic '0' or '1'. Thus, during a read cycle, M1 and M2 serve as the bit line load to establish an appropriate read voltage potential.

The pass transistors of circuitry 60 include transistor pairs PMOS M7, NMOS M8 and PMOS M9, NMOS M10 located on bit lines BL and BLB, respectively. Coupled to common data lines CDL and CDLB are invertors I1 and I2 and NOR gates I3 and I4, respectively. Data input Din and write enable complement WEB signals are supplied to NOR gates I3 and I4.

Briefly, the operation of the write cycle begins when a data signal, logic '0' or '1', is supplied to column CL from data input Din. Suppose a logic '0' from Din is to be written to bit line BL and the WEB signal is logic '0'. NOR gate I3 will output a logic '1', while the inverter I1 will output a logic '0'. A logic '0' from the inverter, comprised of an NMOS transistor coupled to ground and a PMOS transistor coupled to voltage source Vcc (not shown), will turn on the NMOS transistor of I1. Thus, I1 will be driven low towards ground, which, in turn, will pull bit line BL low towards ground (Vss) as well.

On the other hand, bit line BLB will be pulled high since inverter I2, coupled to BLB, will be driven high to Vcc. I2 is driven high since NOR gate I4 will output a logic '0' activating the PMOS transistor coupled to Vcc (not shown). NOR gate I4 outputs a logic '0' since it receives a logic '1' from invertor I5 and a logic '0' from WEB.

However, although many techniques have evolved recently to speed up the SRAM data output in the SRAM column shown in FIG. 3, there has been relatively little effort to increase the write cycle speed which also affects the overall system performance. The speed of the write cycle in a column of an SRAM array is determined by the time it takes the bit line potential to be driven low towards ground.

One factor that decreases the speed of the write cycle includes the series resistance and switching times of the invertors I1, I2, the pass transistors M7–M10 and the select transistors M3–M6. This factor produces an R-C delay which slows the write cycle. Another factor that decreases the write cycle speed includes the inherent properties of the load transistors M1, M2 which tend to pull the bit line high. For example, when bit line BL is being written, load transistor M1 supplies a DC current on BL which drives BL high as the inverter I1 pulls BL low. Since the bit line is likely formed of metal having a resistance of a few hundred ohms, M1 acts as a resistor that builds up an IR (voltage) drop along BL. This is especially true when writing cells near the top of the column, i.e. the cells closest to M1.

Accordingly, it is an object of the present invention to provide an SRAM which has an increased write cycle speed and does not suffer from the short comings of the above-mentioned prior art SRAM schemes.

SUMMARY OF THE INVENTION

These and other objectives are realized by an SRAM column having an increased write cycle speed. The SRAM column includes at least one SRAM cell connected to the bit line and the bit line complement of the column.

In one embodiment, a pair of select transistors are located below the bottom SRAM cell, where one select transistor is connected to the bit line and the other is connected to the bit line complement. The select transistors select whether the respective bit line and bit line complement is deselected or selected. The SRAM column further includes a pair of load transistors connected between the bottom SRAM cell and the pair of select transistors, where one of the load transistors is connected to the bit line and the other load transistor is connected to said bit line complement.

In operation, since the load transistors are located below the bottom cell, the pull up current from the load transistors will not flow through their respective bit line or bit line complement. Therefore, the voltage drop potential on the line is reduced and the bit line or the bit line complement will be pulled lower quicker which increases the write cycle speed.

In another embodiment, a first tri-state buffer circuit has a pair of transistors and a first output node positioned therebetween. The output of the first output node is supplied to the bit line for selectively enabling the bit line during a write cycle. A second tri-state buffer circuit has a pair of transistors and a second output node positioned therebetween. The output of the second output node is supplied to the bit line complement for selectively enabling the bit line complement during a write cycle. By utilizing the tri-state buffers instead of conventional pass resistors, which has a large resistance, the R-C delay is reduced (which reduces the line discharging time) and the write speed is increased.

In a further embodiment, a pair of pull-up transistors are included, where one pull-up transistor is connected to the common data line and the other is connected to the common data line complement. In operation, when either the data line or data line complement is in a read cycle, the respective pull-up transistor is in an on-state. When either the data line or data line complement is in a write cycle, the respective pull-up transistor is in an off-state. The bit line and bit line complement load transistors will be turned off in the selected column by the column select signals. In the read cycle, the pull-up transistors are on and act as the bit line load. In the write cycle, the load and pull-up transistors are all turned off. In this manner the discharge rate of the bit line or bit line complement is increased, which improves the write cycle speed.

BRIEF DESCRIPTION OF THE DRAWING

The following detailed description, given by way of example and not intended to limit the present invention solely thereto, will best be understood in conjunction with the accompanying drawings in which.

DETAILED DESCRIPTION OF THE INVENTION

Figure 1:
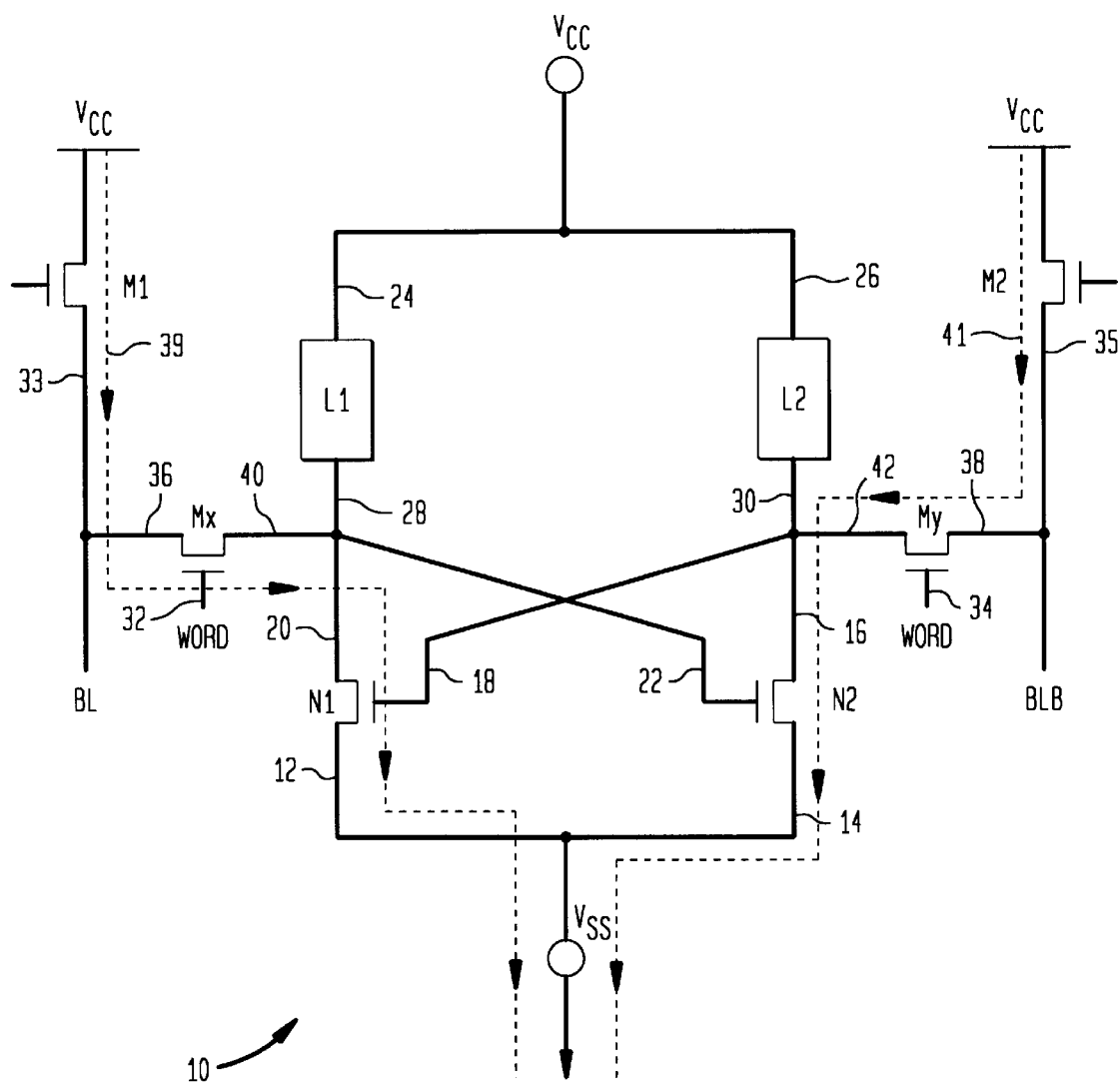
FIG. 1 schematically illustrates a conventional SRAM cell.
Figure 2:
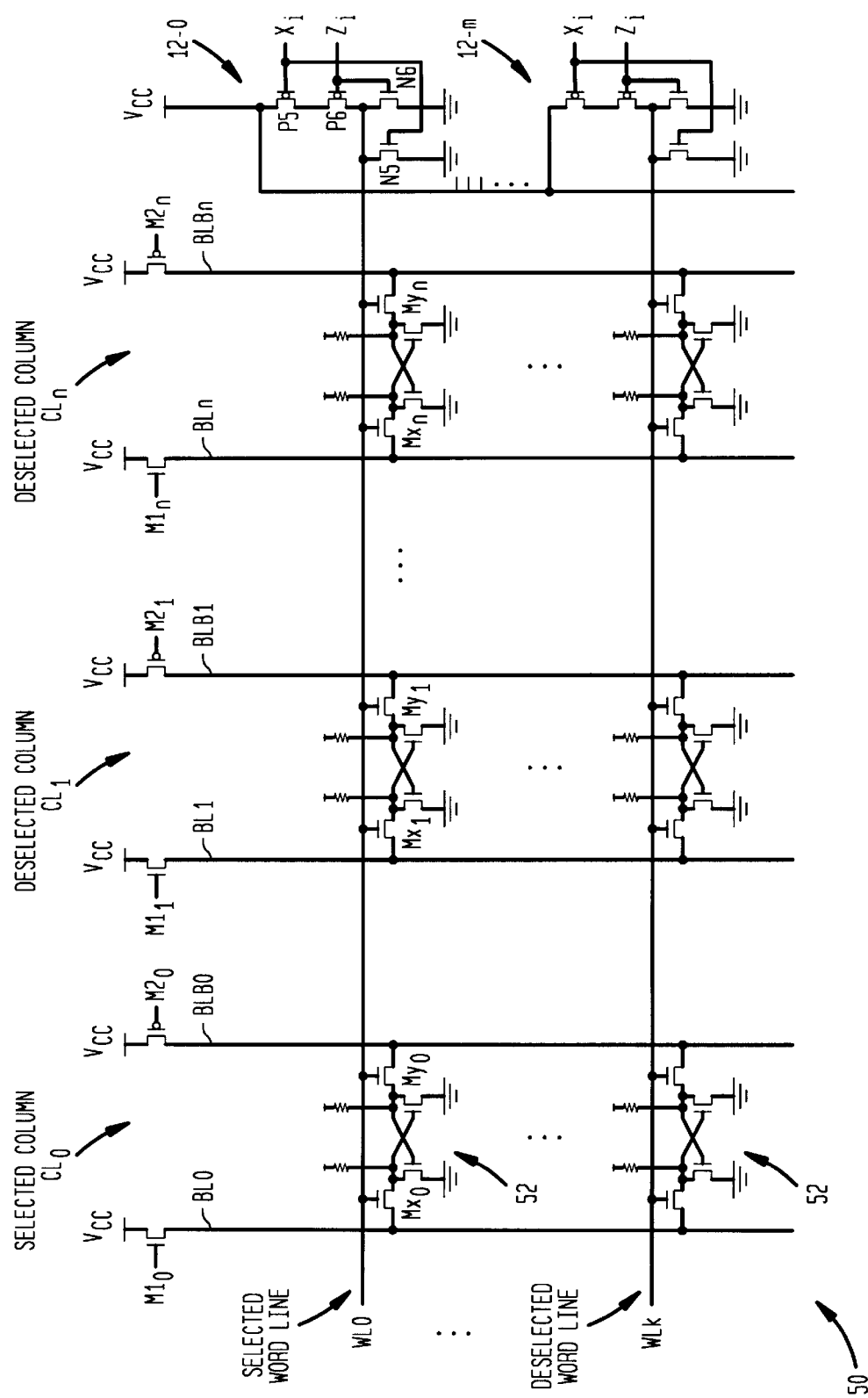
FIG. 2 schematically illustrates a conventional SRAM array.
Figure 3:
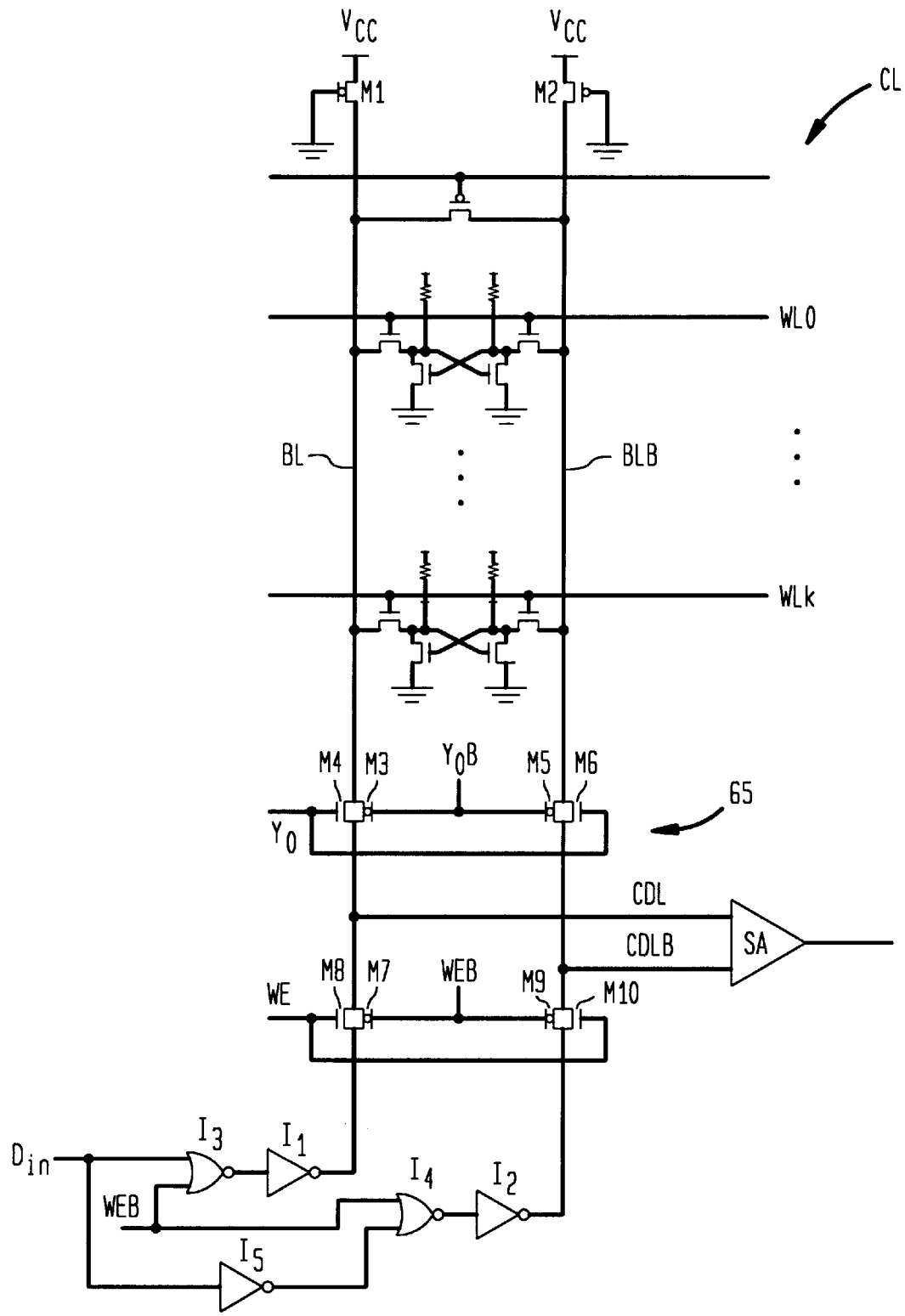
FIG. 3 illustrates in greater detail a conventional SRAM column of the SRAM array of FIG. 3.
Figure 4:
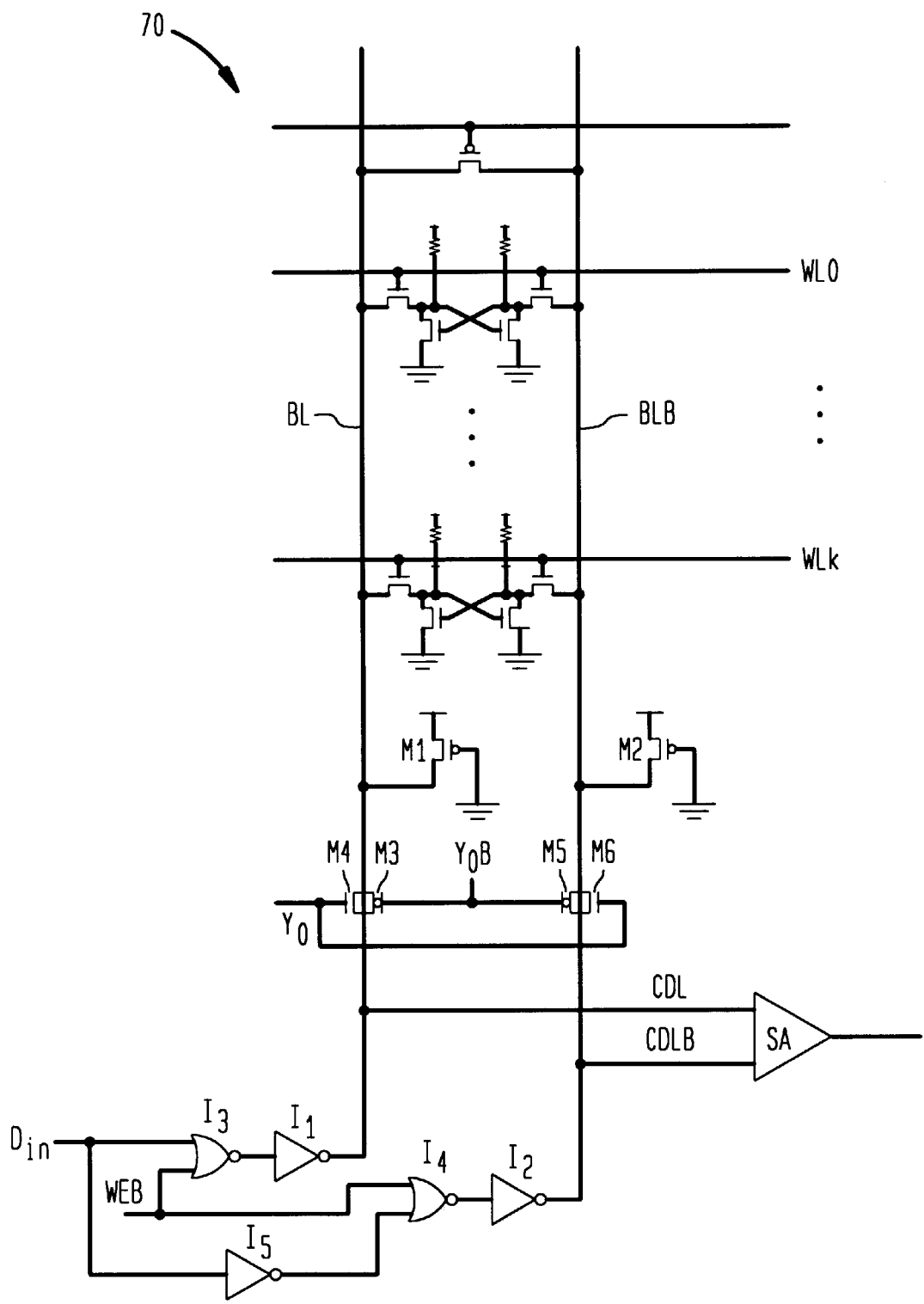
FIG. 4 illustrates an SRAM column in an SRAM array having the load transistors located between the select transistors and the cells in accordance with a first embodiment of the present invention.

FIG. 4 shows an SRAM column 70 in accordance with a first embodiment of the invention. The SRAM column 70 of FIG. 4 is identical to the SRAM column 60 of FIG. 3 except that the load transistors M1, M2 are relocated from the top of column CL0 above the cells. Instead, load transistors M1, M2 are located below any of the cells but above the select transistors M3–6 to avoid the DC voltage drop along the bit line. Such a voltage drop causes a delay in the write cycle.

Figure 5:
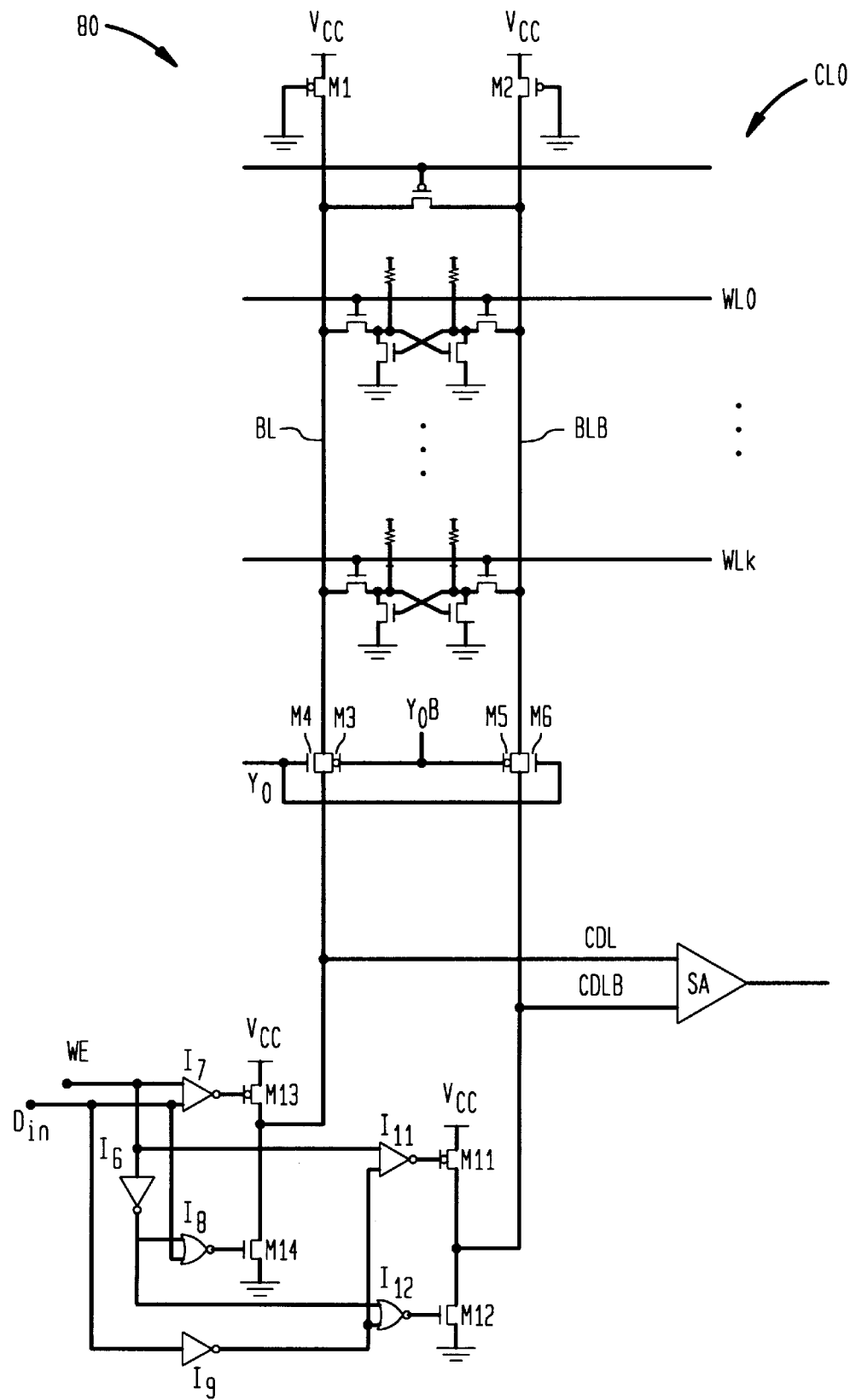
FIG. 5 illustrates an SRAM column in an SRAM array having a tri-state write buffer in accordance with a second embodiment of the present invention.

FIG. 5 shows an SRAM column 80 in accordance with a second embodiment of the invention. The SRAM column 80 of FIG. 5 is identical to the SRAM column 60 of FIG. 3 except that the conventional pass transistors M7–M10 are replaced by tri-state write driver M7–M10.

As previously stated, the conventional pass transistors M7–M10 of FIG. 3 selectively enable the write buffer during a write cycle and disable the write buffer to allow reading via sense amplifier SA. However, there is a relatively high resistance in transistors M7–M10 which amount to a large R-C delay time constant.

Instead, a pair of tri-state write buffers replace the conventional pass gate scheme. A first tri-state write buffer, connected to bit line BL, includes gate transistor pair PMOS M13 and NMOS M14 with an output node N1, and a second tri-state buffer, connected to bit line BLB, includes transistor pair PMOS M11 and NMOS M12 with an output node N2. NAND gate I7 and NOR gate I8 have one input connected to the write enable signal WE (through inverter I6 for the NOR gate I8 input) and the other input connected to the data input Din. The outputs of I7 and I8 are coupled to M13 and M14, respectively. Similarly, NAND gate I11 and NOR gate I12 have one input connected to the write enable signal WE (through inverter I6 for the NOR gate I12 input) and the other input connected to the data input Din through invertor I9. The outputs of I11 and I12 are coupled to M11 and M12, respectively.

During a read cycle, all transistors M11–M14 are off. During a write cycle, the transistors M11–M14 can drive the respective nodes N2 and N1 directly. This eliminates the M7–M10 resistance in the conventional SRAM array and substantially removes the R-C delay factor.

For example, suppose signal Din is logic '0' and signal WE is logic '1'. Then transistor M13, connected to Vcc, is off and transistor M14, connected to ground, is on. Therefore, output node N1 is driven low towards ground which, in turn, drives bit line BL low as well. As stated, the tri-state buffer substantially removes R-C delay and lowers the R-C time constant from the write buffer to the bit line.

Figure 6:
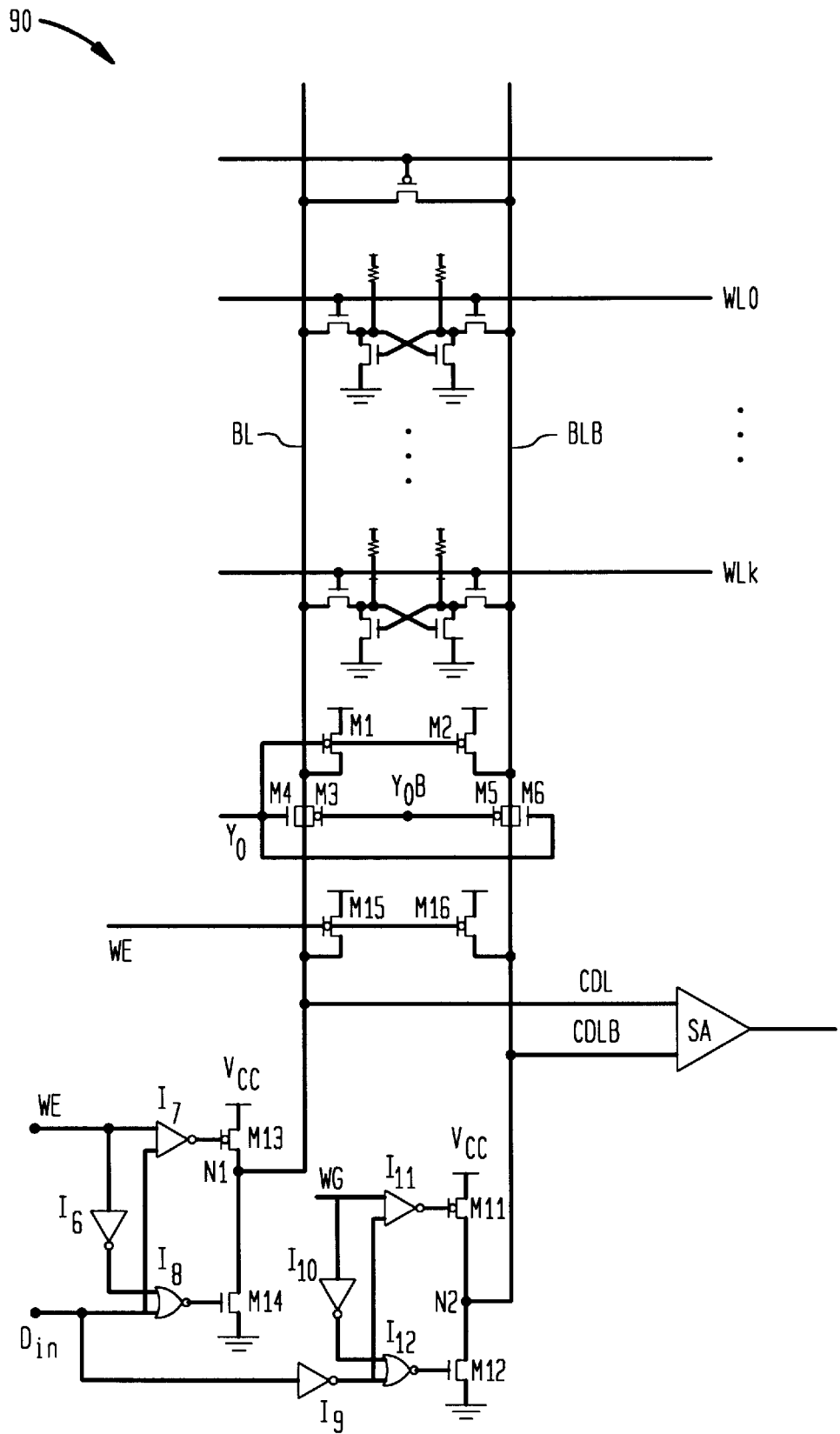
FIG. 6 illustrates an SRAM column in an SRAM array having data line pull-up transistors in accordance with a third embodiment of the present invention.

FIG. 6 shows an SRAM column 90 in accordance with a third embodiment of the invention. The SRAM column 90 of FIG. 5 is essentially a combination of the SRAM column 80 of FIG. 5 having a tri-state write buffer and the SRAM 70 of FIG. 4 having the load transistors M1, M2 relocated. However, in FIG. 6, pull-up transistors M15 and M16 are added between the pass transistors and the tri-state buffer. It should be appreciated that the tri-state write buffer may be substituted for the pass transistors of FIG. 4 or other configurations. In addition, the tri-state buffer of FIG. 6 may optionally replace the pass transistors of FIG. 4.

In operation, the load transistors M1 and M2 are controlled by the column select signals YO and YOB. In deselected columns, columns not to be read or written to, respective load transistors M1/M2 are turned on which keep the deselected columns at a high voltage level. During a read cycle in a selected column, the respective load transistor M1/M2 is turned off and the sense level (voltage difference between the bit line and load transistor) is established by signal WE activating the respective pull-up transistors M15/M16 for generating the sense level during the read cycle. During the write cycle, the respective load transistor M1/M2 is disabled. The function of the load transistor is replaced by the respective pull-up transistor M15/M16 which are turned off (again under the control of signal WE). This speeds up the write cycle since the pull-up transistors are typically large, which slow down the discharging rate of the bit line. For example, write cycle of bit line BL, since pull-up transistor M16 on line BLB is off, transistor M11 drives line BLB high toward the voltage source Vcc.

Finally, the above-discussion is intended to be merely illustrative of the invention. Numerous alternative embodiments may be devised by those having ordinary skill in the art without departing from the spirit and scope of the following claims.

The claimed invention is:

1. An SRAM column having an increased write cycle speed, comprising:
    at least one SRAM cell, each said cell being connected to a bit line and a bit line complement;
    at least one first pull-up transistor connected to a data line, said data line being selectively connected to said bit line; and
    at least one second pull-up transistor connected to a data line complement, said data line complement being selectively connected to said bit line complement,
    wherein the respective pull-up transistor being in an on-state when the corresponding one of said data line or data line complement is in a read cycle, and wherein said respective pull-up transistor being in an off-state when the corresponding one of said bit line or bit line complement is in a write cycle for increasing the discharge rate of the corresponding line to increase said write cycle speed.

2. The SRAM column of claim 1 further comprising a pair of load transistors, wherein one of said load transistors is connected to said bit line below any said at least one cell and the other is connected to said bit line complement below any said at least one cell, such that said load transistors are off in a column selected for writing to increase the write cycle speed.

3. The SRAM column of claim 2 further comprising:
    a first tri-state write buffer circuit having a first pair of transistors, separated by a first output node, such that the output of said first output node is supplied to said data line for selectively enabling said data line during said write cycle; and
    a second tri-state write buffer circuit having a second pair of transistors, separated by a second output node, such that the output of said second output node is supplied to said data line complement for selectively enabling said data line complement during said write cycle.

* * * * *